US009229082B2

(12) United States Patent
Guo et al.

(10) Patent No.: US 9,229,082 B2
(45) Date of Patent: Jan. 5, 2016

(54) METHOD FOR DIFFUSION MAGNETIC RESONANCE IMAGING
(71) Applicant: Tsinghua University, Beijing (CN)
(72) Inventors: Hua Guo, Beijing (CN); Feng Huang, Gainesville, FL (US); Xiaodong Ma, Beijing (CN); Wenchuan Wu, Beijing (CN); Chun Yuan, Beijing (CN)
(73) Assignee: TSINGHUA UNIVERSITY, Beijing (CN)
( * ) Notice: Subject to any disclaimer, the term of this patent is extended or adjusted under 35 U.S.C. 154(b) by 648 days.
(21) Appl. No.: 13/676,184
(22) Filed: Nov. 14, 2012
(65) Prior Publication Data
US 2014/0091793 A1    Apr. 3, 2014
(30) Foreign Application Priority Data Sep. 28, 2012  (CN) .................. 2012 1 0367752.2
Oct. 12, 2012  (CN) .................. 2012 1 0388038.1

(51) Int. Cl.
*G01R 33/561* (2006.01)
*G01R 33/563* (2006.01)
*G01R 33/48* (2006.01)
(52) U.S. Cl.
CPC ...... *G01R 33/5611* (2013.01); *G01R 33/56341* (2013.01); *G01R 33/4824* (2013.01)
(58) Field of Classification Search
CPC .................................................. G01R 33/5611
USPC ........................................................ 324/309
See application file for complete search history.

(56) References Cited

U.S. PATENT DOCUMENTS

| | | | | |
|---|---|---|---|---|
| 5,969,524 A * | 10/1999 | Pierpaoli et al. . | G01R 35/56341 | 324/307 |
| 6,445,184 B1 * | 9/2002 | Tanttu .............. | G01R 33/56341 | 324/307 |
| 6,853,191 B1 * | 2/2005 | Miller et al. ...... | G01R 33/56509 | 324/307 |
| 2002/0036499 A1 * | 3/2002 | Thesen ............. | G01R 33/56509 | 324/307 |
| 2003/0160612 A1 * | 8/2003 | Yablonskiy et al. ................. | G01R 33/56341 | 324/309 |
| 2005/0100202 A1 * | 5/2005 | Huang ............... | G01R 33/5611 | 382/128 |
| 2007/0249927 A1 * | 10/2007 | Basser et al. ..... | G01R 33/56341 | 600/410 |
| 2009/0273344 A1 * | 11/2009 | Fain et al. ......... | G01R 33/50 | 324/307 |
| 2009/0284257 A1 * | 11/2009 | Bammer et al. . | G01R 33/56509 | 324/307 |
| 2010/0135560 A1 * | 6/2010 | Embleton et al. | G01R 33/56341 | 382/131 |
| 2010/0329528 A1 * | 12/2010 | Hajnal et al. ..... | A61B 5/055 | 382/131 |
| 2011/0199084 A1 * | 8/2011 | Hasan ................ | A61B 5/055 | 324/309 |

* cited by examiner

*Primary Examiner* — Rodney Fuller
(74) *Attorney, Agent, or Firm* — Houtteman Law LLC

(57) ABSTRACT

A method for diffusion magnetic resonance imaging may be provided. The method may comprise steps of performing sampling on an object at N diffusion weighted directions to acquire undersampled but complementary k-space data, combining the complementary data from different directions to obtain a full sampled k-space data, performing initial reconstruction based on common information among images at the N diffusion weighted directions, and performing joint iterative regularized reconstruction to k-space data in all diffusion weighted directions based on the initial images to obtain the desired final images. Due to the utilization of common information at the N diffusion weighted directions, the acquisition efficiency may be enhanced and image resolution and SNR of acquired images may be improved accordingly.

15 Claims, 5 Drawing Sheets

METHOD FOR DIFFUSION MAGNETIC RESONANCE IMAGING

CROSS-REFERENCE TO RELATED APPLICATIONS

This application claims priorities to Chinese Patent Application No. 201210367752.2, titled "image processing method based on diffusion magnetic resonance imaging", filed with State Intellectual Property Office (SIPO) on Sep. 28, 2012, and Chinese Patent Application No. 201210388038.1, titled "method for diffusion magnetic resonance imaging", filed with State Intellectual Property Office (SIPO) on Oct. 12, 2012, which are hereby incorporated by reference in its entirety.

FIELD

The present disclosure generally relates to the field of magnetic resonance imaging (MRI), more particularly, to a method for diffusion magnetic resonance imaging.

BACKGROUND

Diffusion weighted imaging (DWI) in MRI can probe microstructure of the tissue. It not only provides structural but also functional information, thus it has tremendous potentials in application of the clinical and neuroimaging. However, at the current moment diffusion imaging uses single shot acquisition method to suppress motion artifacts, which inevitably has low spatial resolution, low signal to noise ratio (SNR) and image distortion artifacts. With the increasing demand in the clinical and neuroscience research, diffusion weighted images are expected to provide high resolution and high SNR. For traditional MRI, however, it is always a challenge to improve spatial resolution and SNR while keeping the scan time relatively short.

With the recent introduction of parallel imaging, the acquisition time can be reduced while image resolution can be improved. Parallel imaging makes full use of the distinct sensitivities of individual element of multiple-channel coils that allow one to sample k-space more sparsely and thus more quickly. The acceleration of k-space traveling along the phase encoding direction is controlled by the reduction factor, R, which is the ratio between the number of full phase-encoding lines and that of undersampling lines. However, parallel imaging scans come with a SNR penalty that is proportional to square root of R plus an extra geometry-related factor. For that restriction, R not larger than 2 is usually adopted in practice. Up to now, there are no reliable imaging and reconstruction methods established yet for preserving SNR while reducing acquisition time simultaneously.

SUMMARY

The present disclosure may be provided to solving at least one problem existing in the art.

In viewing thereof, a method for diffusion magnetic resonance imaging may need to be provided, so that the acquisition efficiency may be improved while imaging time may be reduced.

In addition, a method for diffusion magnetic resonance imaging may also need to be provided, which may improve resolution and SNR of reconstructed images accordingly.

According to an embodiment of the present disclosure, a method for diffusion magnetic resonance imaging may be provided. The method may comprise the steps of performing sampling on an object to be sampled at N diffusion weighted directions via multiple-channel coils to acquire k-space data for the N diffusion weighted directions in which a sampling trajectory sampled from any one of the N diffusion weighted directions is complementary with sampling trajectories from the remaining diffusion weighted directions (step S1), combining the complementary k-space data acquired to obtain a full sampled k-space data Kc (step S2), performing initial reconstruction to obtain an initial image $(\bar{I}_1, \ldots, \bar{I}_N)$ based on images corresponding to the k-space data at the N diffusion weighted directions and an image corresponding to the full sampled k-space data Kc (step S3), and performing joint iterative regularized reconstruction to the k-space data in all diffusion directions based on the initial image $(\bar{I}_1, \ldots, \bar{I}_N)$ to obtain the desired final image $(I_1, \ldots, I_N)$ (step S4).

According to the method of the present disclosure, resolution and SNR of the images acquired via diffusion magnetic resonance imaging may be improved tremendously.

According to an embodiment of the present disclosure, the joint iterative regularized reconstruction may be performed by the following first reconstruction model:

$$[S_1, \ldots, S_{Nc}, I_1, \ldots I_N] = \operatorname*{argmin}_{I,S} \sum_{n=1}^{N} \left( \sum_{i=1}^{Nc} \|F_p(S_i I_n) - K_{correct}^{n,i}\|_2^2 \right) + \lambda \|I_n - \bar{I}_n\|_2^2 ),$$

where N is the total number of the diffusion weighted directions, Nc is the channel number of the multiple-channel coils, $S_1, \ldots, S_{Nc}$ are coil sensitivities of the channels respectively, $I_1, \ldots I_N$ are the desired final images at the N diffusion weighted directions, $F_p$ is the mapping from image domain to k-space, $K_{correct}^{n,i}$ is the k-space data of the $i^{th}$ coil channel at the $n^{th}$ diffusion weighted direction, and $\lambda$ is a regularization factor.

According to an embodiment of the present disclosure, the joint iterative regularized reconstruction may be performed by the following second reconstruction model:

$$[S_1, \ldots, S_{Nc}, \delta I_1, \ldots \delta I_N] = \operatorname*{argmin}_{I} \sum_{n=1}^{N} \left( \sum_{i=1}^{Nc} \|F_p(S_i \cdot \delta I_n) - \delta K_{correct}^{n,i}\|_2^2 + \lambda \|\delta I_n\|_{L1} \right),$$

where N is the total number of the diffusion weighted directions, Nc is the channel number of the multiple-channel coils, $S_1, \ldots, S_{Nc}$ are coil sensitivities of the channels respectively, $I_1, \ldots I_N$ are the desired final images at the N diffusion weighted directions, $F_p$ is the mapping from image domain to k-space, $K_{correct}^{n,i}$ is the k-space data of the $i^{th}$ coil channel at the $n^{th}$ diffusion weighted direction, and $\lambda$ is a regularization factor, $\delta I_1, \ldots \delta I_N$ are differences between the final images and the initial images, $\delta K_{correct}^{n,i}$ correct is the residual undersampling data obtained by subtracting the k-space data corresponding to the initial image from the undersampled k-space data of the $i^{th}$ coil channel at the $n^{th}$ diffusion weighted direction, the notation L1 represents L1 norm. In this reconstruction model, the concepts of compressed sensing is adopted, and by subtracting k-space data corresponding to the initial images from the k-space data acquired, the sparsity of the reconstructed images $\delta I_1, \ldots \delta I_N$ in image domain may be enhanced tremendously, thus ameliorating the reconstruction effect based on the theory of compressed sensing.

According to an embodiment of the present disclosure, the k-space data is acquired by parallel undersampling on the object at the N diffusion weighted directions via the multiple-channel coils. Thus, according to the method of the present disclosure, the sampling efficiency may be improved and the imaging time may be reduced to a great extent by parallel undersampling.

According to an embodiment of the present disclosure, the sampling is performed by at least one of echo planar imaging, fast spin echo imaging, Periodically Rotated Overlapping ParallEL Lines with Enhanced Reconstruction (PROPELLER) imaging, spiral imaging, and variable density spiral (VDS) imaging.

According to an embodiment of the present disclosure, the sampling is performed by single-shot imaging or multi-shot imaging with navigator data.

According to an embodiment of the present disclosure, the initial reconstruction and joint iterative reconstruction are performed based on common or mutual information among the images corresponding to the k-space data at the N diffusion weighted directions.

According to an embodiment of the present disclosure, the common or mutual information is anatomy information, tissue characteristics of the object to be sampled, information relating to a main magnetic field and a transmitting magnetic field applied for sampling the object, sensitivities of receiving coils in the multiple-channel coils or scanning parameters during the diffusion magnetic resonance imaging.

Thus, by the utilization of the common information, sampling time may be reduced and images with enhanced SNR may be obtained accordingly.

According to an embodiment of the present disclosure, the k-space data is performed with phase correction to obtain corrected data $K_{correct}^{n,i}$ at the N diffusion weighted directions, where n=1, 2, . . . , N, i=1, 2, . . . , Nc.

According to an embodiment of the present disclosure, the corrected data $K_{correct}^{n,i}$ is obtained by performing on the k-space data with linear or non-linear correction method based on navigator data.

According to an embodiment of the present disclosure, the step S3 further comprises: S31: performing reconstruction on the full sampled k-space data Kc to obtain a first image $I_{high}^{c}$; S32: performing reconstruction to obtain a second image $I_{low}^{c}$ how by using data satisfying Nyquist-Shannon sampling theorem from a center portion of the full sampled k-space data Kc; S33: performing reconstruction to obtain a third image $I_{low}^{n}$ by using data satisfying Nyquist-Shannon sampling theorem cropped from center portions of the corrected data $K_{correct}^{n,i}$ where n=1, 2, . . . N; and S34: performing initial reconstruction to obtain the initial image $(I_1, \ldots, I_N)$ based on the first image $I_{high}^{c}$, the second image $I_{low}^{c}$, and the third image $I_{low}^{n}$.

According to an embodiment of the present disclosure, the initial image $\bar{I}_n$ is obtained by image ratio constrained reconstruction using the following formula based on the first image $\bar{I}_{high}^{c}$, the second image $\bar{I}_{low}^{c}$, and the third image $\bar{I}_{low}^{n}$ in the step S34:

$$\bar{I}_n = \bar{I}_{high}^{c} \cdot \frac{\bar{I}_{low}^{n}}{\bar{I}_{low}^{c}},$$

n=1, 2, . . . , N.

According to an embodiment of the present disclosure, the initial reconstruction and the joint iterative regularized reconstruction may be performed with at least one of multi-contrast image reconstruction method based on image ratio, compressed sensing, independent component analysis method and multi-contrast image reconstruction using joint entropy.

According to an embodiment of the present disclosure, an iteratively regularized Gauss-Newton method is used for iteration in the step S4.

According to an embodiment of the present disclosure, a conjugate gradient method is used for iteration computation in the step S4.

The above summary of the present disclosure is not intended to describe each disclosed embodiment or every implementation of the present disclosure. The Figures and the detailed description which follow more particularly exemplify illustrative embodiments.

Additional aspects and advantages of the embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions made with reference the accompanying drawings, in which.

DETAILED DESCRIPTION

Figure 1:
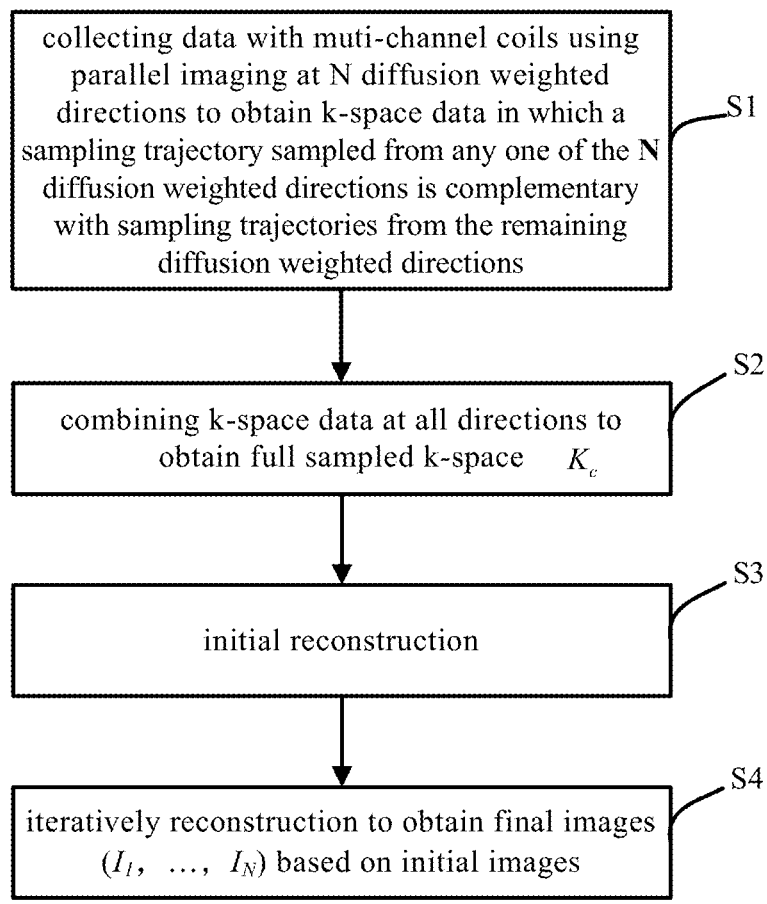
FIG. 1 is a flow diagram of a method for diffusion magnetic resonance imaging according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the description, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

For diffusion weighted magnetic resonance imaging, the collected signal M(t) can be expressed in the following equation:

$$M(t) = M_0 \cdot \exp[b\underline{D}] \quad (1)$$

The equation may comprise an initial transverse magnetization $M_0$ and a diffusion weighted term $\exp[b\underline{D}]$ where b is the applied diffusion gradient factor and $\underline{\underline{D}}$ is the desired diffusion tensor or diffusion coefficient. For spin echo diffusion tensor imaging, the equation may be further expressed as follows:

$$M(t) = S \cdot \rho(B_1^+, B_0)(1 - e^{-TR/T_1})e^{-TE/T_2} \cdot \exp\left[-\int_0^t k^T(t') \cdot \underline{\underline{D}} \cdot k(t') dt'\right] \quad (2)$$

where $$k(t') = \gamma \int_0^{t'} g_{diffusion}(\tau) d\tau.$$

In the second equation as presented above, $\rho$ represents proton density which is dependent on a main magnetic field $B_0$ and a transmitting magnetic field $B_1^+$, S represents the sensitivity of a receiving coil in the multiple-channel coils, $T_1$ and $T_2$ represent transverse and longitudinal relaxation time respectively, TR represents repetition time, and TE represents echo time.

For the signals collected from each diffusion weighted direction, except the applying direction of the diffusion gradients and the diffusion tensor $\underline{\underline{D}}$, the remaining in the equation are the same including, without limitation to, $\rho$, $B_0$, $B_1^+$, S, $T_1$ and $T_2$ etc. Therefore, accordingly, images acquired from different directions share common or mutual information except image contrast. The common or mutual information of the images acquired from the different directions may be utilized for image reconstruction to enhance image resolution and SNR and increase imaging speed while reducing redundant information acquisition.

In the present disclosure, the inventors, for the first time, propose the concept of common information existing at different diffusion weighted directions which has been proven useful in data collection and image reconstruction. Compared with conventional parallel imaging method, the novel method proposed or contemplated by the current inventors may significantly improve SNR of the obtained images while achieving larger acceleration rate during sampling.

Based on the research above, according to an embodiment of the present disclosure, a method for diffusion magnetic resonance imaging may be provided. The method may comprise the steps of performing sampling on an object to be sampled via multiple-channel coils at N diffusion weighted directions in which a sampling trajectory for any one of the N diffusion weighted directions is complementary with sampling trajectories from the remaining diffusion weighted directions (step S1), combining the complementary k-space data acquired to obtain a full sampled k-space data Kc (step S2), performing initial reconstruction to obtain an initial image $(\tilde{I}_1, \ldots, \tilde{I}_N)$ based on images corresponding to the k-space data at the N diffusion weighted directions and an image corresponding to the full sampled k-space data Kc (step S3), and performing joint iterative regularized reconstruction to the initial image $(\tilde{I}_1, \ldots, \tilde{I}_N)$ to obtain the desired final image $(I_1, \ldots, I_N)$ (step S4).

According to the method of the present disclosure, the sampling efficiency may be improved tremendously whereas increasing the resolution and SNR of the images acquired with diffusion weighted MRI.

In the following, each step mentioned above will be described in detail with reference to accompanying figures. More particularly, the method may substantially split into data collection, phase correction, initial reconstruction and joint reconstruction. The following discloses a concrete embodiment for implementing structures of the present disclosure. However, it should be noted that, besides the embodiment described herein, other method different from that described in the present disclosure may also achieve the present disclosure.

In the following detailed description of exemplary embodiments, reference is made to the accompanying figures of the drawing which form a part hereof, and in which are shown, by way of illustration, specific embodiments in which the methods described herein may be practiced. It is to be understood that other embodiments may be utilized and structural changes may be made without departing from the scope of the present invention.

Data Acquisition

Figure 2A:
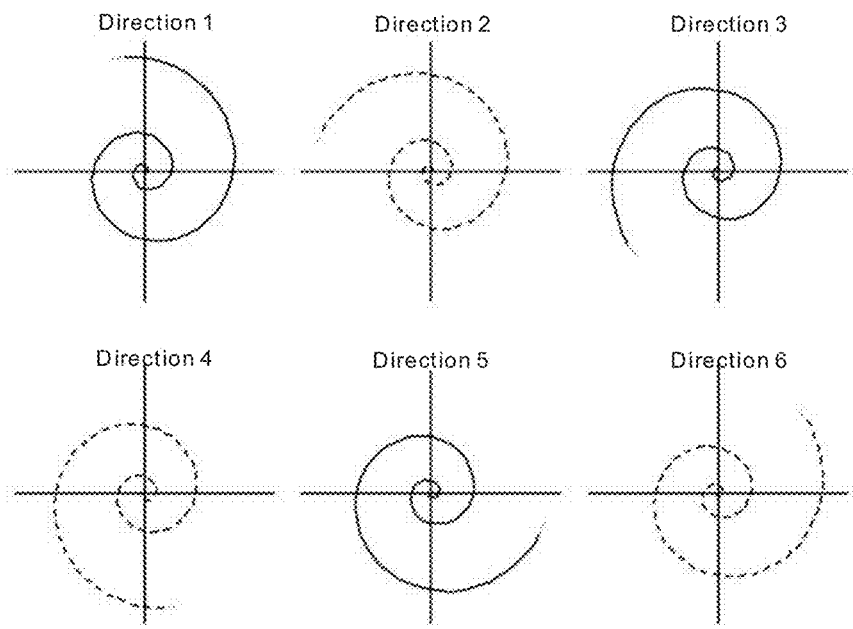
FIG. 2A is a schematic view of sampling trajectories with undersampling acceleration from k-spaces at N (N=6) diffusion weighted directions respectively.
Figure 2B:
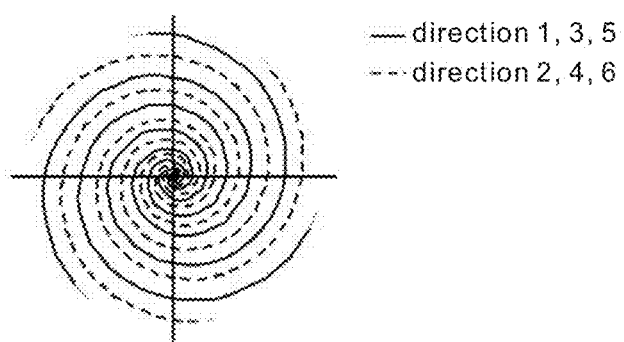
FIG. 2B is a schematic view of a full sampled k-space after combining.
Figure 3:
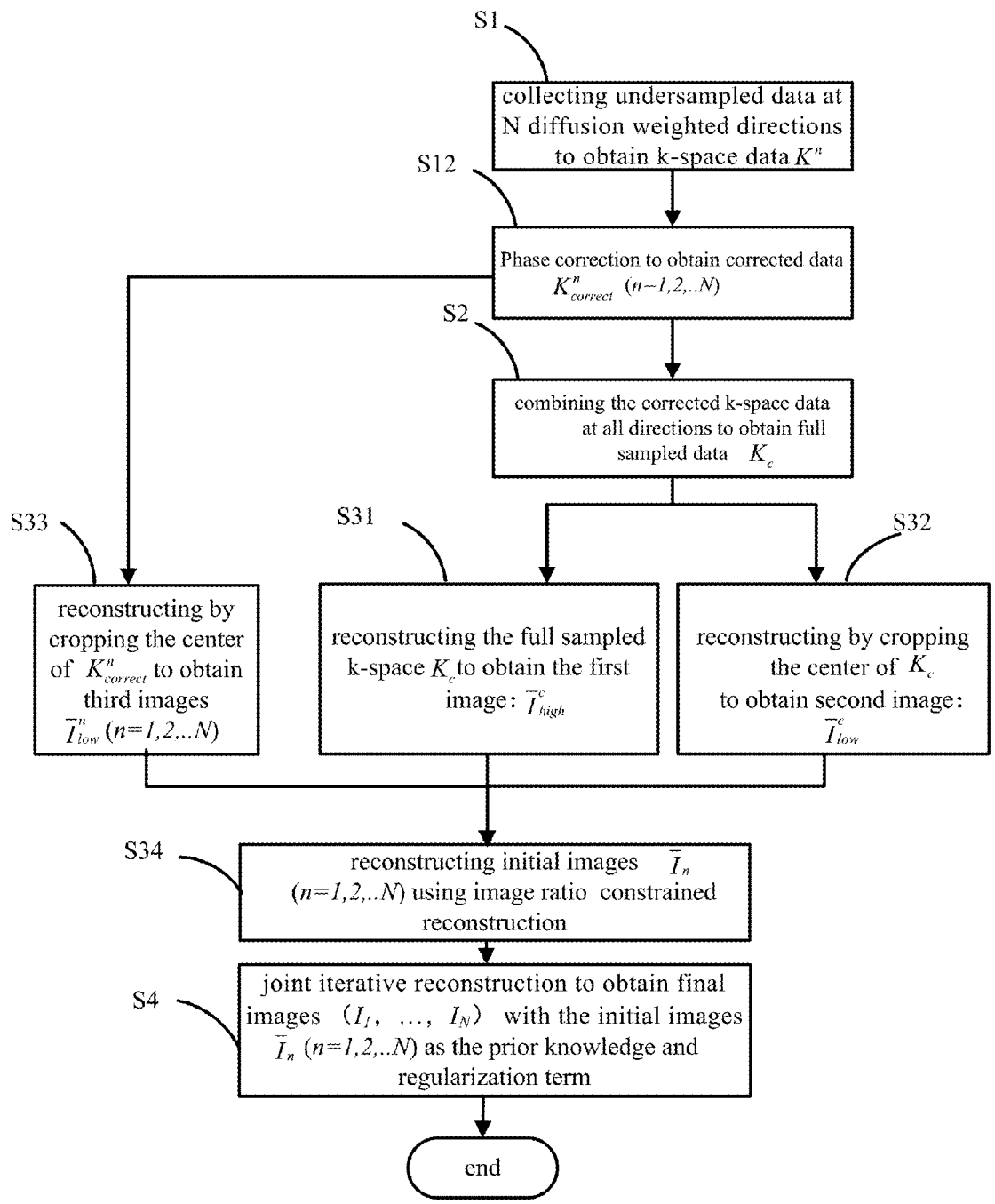
FIG. 3 is a schematic view for processing images in a method for diffusion magnetic resonance imaging according to an embodiment of the present disclosure.

Firstly, with reference to parallel imaging, data acquisition is performed by, for example, parallel undersampling for all the N diffusion weighted directions. It should be noted that trajectories corresponding to the acquired data at different directions are complementary. That is, during sampling a sampling trajectory sampled from any one of the N diffusion weighted directions is complementary with sampling trajectories from the remaining diffusion weighted directions so that the k-space data undersampled at all the diffusion weighted directions corresponding to the trajectories may be combined to obtain a full sampled k-space data Kc, as shown in FIG. 2A and FIG. 2B, where N=6.

In the step S1 of data acquisition, according to an embodiment of the present disclosure, the k-space data is acquired by parallel undersampling to the object to be sampled at the N diffusion weighted directions via the multiple-channel coils. Thus, according to the method of the present disclosure, the sampling efficiency may be improved and the imaging time may be reduced to a great extent by the parallel undersampling.

During data acquisition, based on the parallel imaging via the multiple-channel coils, the trajectories corresponding to the N diffusion weighted directions are complementary. The term "complementary" as described herein means that trajectories corresponding to data collected from different directions are different from each other. And all the k-space data corresponding to the trajectories obtained may be combined to obtain the full sampled k-space data Kc.

In the following, diffusion tensor imaging using variable density spiral (VDS) trajectory may be used for, without limitation, illustration to expound the process of parallel undersampling data collection. If full sampling requires 6*M scanning arms for each of 6 (N=6) diffusion weighted directions, parallel imaging with an acceleration factor of 6 is performed for the 1$^{st}$ diffusion weighted direction to obtain M scanning arms ($1^{st}$, $7^{th}$, $13^{th}$, ..., $M^{th}$). For the remaining direction, the M scanning arms are rotated at a same angle interval of 60 degrees, i.e. 360°/N, such that all the scanning arms are distributed evenly on the k-space. FIG. 2A is a schematic view of sampling trajectories with undersampling acceleration from k-spaces at the N (N=6) diffusion weighted directions respectively. For exemplary purpose, only the first sampling arm is shown for each of the 6 (N=6) diffusion weighted directions. Before image reconstruction, the k-space data of different diffusion weighted directions are combined according to their original trajectories to obtain the full sampled k-space data $k_c$ as shown in FIG. 2B, for obtaining the desired final image $I_n$ with high resolution and high SNR at the further steps described herein below, where n=1, 2, ..., N. FIG. 2B is a schematic view of a full sampled k-space after combining.

Thus, by achieving a data acquisition mode in which data from the N diffusion weighted directions are complementary with each other, redundant information acquisition may be reduced, thus accelerating imaging speed as described hereinafter.

Further, according to an embodiment of the present disclosure, the sampling is performed by at least one of echo planar imaging, fast spin echo imaging, PROPELLER imaging, spiral imaging, and variable density spiral (VDS) imaging.

Phase Correction

For multi shot diffusion imaging, it should be noted that the k-space data acquired may need to be performed with phase correction (step S12), to obtain a corrected data $K_{correct}^{n,i}$ corresponding to the N diffusion weighted directions, where n=1, 2, ..., N, and i=1, 2, ..., Nc. According to an embodiment of the present disclosure, the corrected data $K_{correct}^{n,i}$ is obtained by performing on the k-space data with linear or non-linear correction method based on navigator data. For example, with the VDS diffusion tensor imaging, the over-sampling data in center k-space may be treated as the navigator information to eliminate the phase error among different shots, i.e. to eliminate phase errors between the scanning arms.

Initial Reconstruction

To adequately utilizing the common information at different diffusion weighted directions for increasing image resolution and SNR, initial estimation needs to be performed with the images. It should be noted that the common information here may be anatomy information and/or tissue characteristics of the object to be sampled, information relating to the main magnetic field and the transmitting magnetic field applied for sampling the object, sensitivities of the receiving coils in the multi-channel coils or scanning parameters during the diffusion magnetic resonance imaging. Thus, by utilizing the common information, sampling time may be reduced and images with increased SNR may be obtained accordingly.

And the image estimation or initial image reconstruction based on the common information may adopt different methods such as multi-contrast image reconstruction method based on compressed sensing, independent component analysis method, or multi-contrast image reconstruction using joint entropy etc. According to an embodiment of the present disclosure, image ratio constrained reconstruction may be illustrated for exemplary purpose.

In the following concrete steps for performing the initial reconstruction are described with reference to FIG. 4. According to an embodiment of the present disclosure, the step S3 further comprises the following steps: S31: performing reconstruction on the full sampled k-space data Kc to obtain a first image $\bar{I}_{high}^c$, here the first image $\bar{I}_{high}^c$ is an image with high resolution and high SNR; S32: performing reconstruction to obtain a second image $\bar{I}_{low}^c$ from the data satisfying Nyquist-Shannon sampling theorem extracted from a center portion of the full sampled k-space data Kc. Here, the second image $\bar{I}_{low}^c$ is one with low resolution; S33: performing reconstruction to obtain a third image $\bar{I}_{low}^n$ from the data satisfying Nyquist-Shannon sampling theorem extracted from center portions of the corrected data $K_{correct}^{n,i}$ where n=1, 2, ... N; and S34: performing initial reconstruction to the k-space data in all diffusion weighted directions to obtain the initial image $(\bar{I}_1, \ldots, \bar{I}_N)$ based on the first image $\bar{I}_{high}^c$, the second image $\bar{I}_{low}^c$, and the third image $\bar{I}_{low}^n$.

Figure 4:
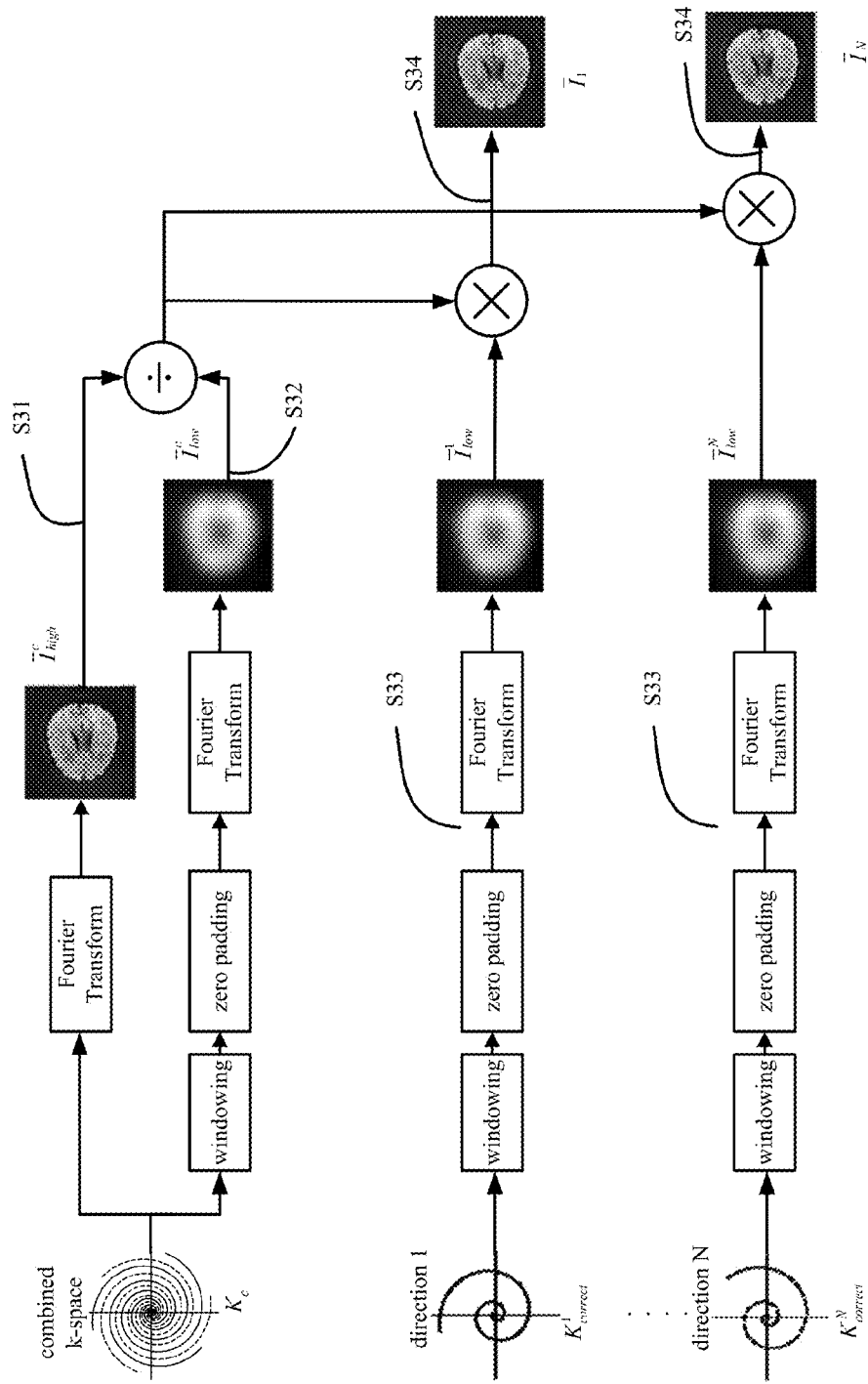
FIG. 4 is a flow diagram for performing initial image reconstruction according to an embodiment of the present disclosure.

It should be noted that, as shown in FIG. 4, extracting data from center portions of the full sampled k-space data $K_c$ or the corrected data $K_{correct}^{n,i}$ may be performed with a window function before obtaining the second image $\bar{I}_{low}^c$ and the third image $\bar{I}_{low}^n$. In addition, due to the absence of the outer portion data, zero-padding needs to be performed to facilitate the following calculation.

The principles of the image ratio constrained reconstruction applied to the data processing are as follows: the common information among the images corresponding to the different diffusion weighted directions mainly correlate to the high frequency portions rather than the low frequency portions. Thus, when a subject has the same position being scanned in different diffusion weighted directions, the images share the same anatomy information with the differences only lying in the image contrast which is determined by the low frequency portion. And the low frequency portion is corresponding to the center of the k-space. According to an embodiment of the present disclosure, the common or mutual information may be anatomy information, tissue characteristics of the object to be sampled, information relating to a main magnetic field and a transmitting magnetic field applied for sampling the object, sensitivities of receiving coils in the multiple-channel coils or scanning parameters during the diffusion magnetic resonance imaging.

The image ratio constrained reconstruction may be expressed as the following equation:

$$\text{ratio} = \frac{\bar{I}_n}{\bar{I}_{high}^c} = \frac{\bar{I}_{low}^n}{\bar{I}_{low}^c}, n = 1, 2, \ldots, N, \quad (3)$$

Here, the ratio represents the one between the pixels of two images.

That is to say, according to an embodiment of the present disclosure, the initial image $\bar{I}_n$ may be obtained by image ratio constrained reconstruction using the following formula based on the first image $\bar{I}_{high}^c$, the second image $\bar{I}_{low}^c$, and the third image $\bar{I}_{low}^n$ in the step S34:

$$\bar{I}_n = \bar{I}_{high}^c \cdot \frac{\bar{I}_{low}^n}{\bar{I}_{low}^c}, n = 1, 2, \ldots, N. \quad (4)$$

In the equation (4) above, the multiplicity and the division are performed on the contrast value or intensity value of each pixel.

When the initial image $\bar{I}_n$ is obtained through the above steps, the joint reconstruction may be performed, which will be further described in details in the following.

Joint Reconstruction

In the steps of initial reconstruction above, it should be noted that the initial image $\bar{I}_n$ obtained through, for example, the image ratio constrained initial reconstruction is only an estimated value. To eliminate the errors in the initial estimated image $\bar{I}_n$, regularized reconstruction model may be established for joint iterative solution. According to an embodiment of the present disclosure, the following regularized reconstruction models may be used for iteration to obtain the desired final image $(I_1, \ldots, I_N)$.

According to an embodiment of the present disclosure, the joint iterative regularized reconstruction may be performed by the following first reconstruction model:

$$[S_1, \ldots, S_{Nc}, I_1, \ldots I_N] = \quad (5)$$
$$\operatorname*{argmin}_{I,S} \sum_{n=1}^{N} \left( \sum_{i=1}^{Nc} \|F_p(S_i I_n) - K_{correct}^{n,i}\|_2^2 \right) + \lambda \|I_n - \bar{I}_n\|_2^2),$$

where N is the total number of the diffusion weighted directions, Nc is the channel number of the multiple-channel coils, $S_1, \ldots S_{Nc}$ are coil sensitivities of the channels respectively, $I_1, \ldots I_N$ are the desired final images at the N diffusion weighted directions, $f_p$ is the mapping from image domain to k-space, $K_{correct}^{n,i}$ is the k-space data of the $i^{th}$ coil channel at the $n^{th}$ diffusion weighted direction, and $\lambda$ is a regularization factor for balancing data consistency and regularization term.

Alternatively, according to an embodiment of the present disclosure, the following second reconstruction model may be used for performing the joint iterative regularized reconstruction:

$$[S_1, \ldots, S_{Nc}, \delta I_1, \ldots \delta I_N] = \quad (6)$$

$$\operatorname*{argmin}_{I} \sum_{n=1}^{N} \left( \sum_{i=1}^{Nc} \|F_p(S_i \cdot \delta I_n) - \delta K_{correct}^{n,i}\|_2^2 + \lambda \|\delta I_n\|_{L1} \right),$$

where N is the total number of the diffusion weighted directions, Nc is the channel number of the multiple-channel coils, $S_1, \ldots, S_{Nc}$ are coil sensitivities of the channels respectively, $I_1, \ldots I_N$ are the desired final images at the N diffusion weighted directions, $F_p$ is the mapping from image domain to k-space, $K_{correct}^{n,i}$ is the k-space data of the $i^{th}$ coil channel at the $n^{th}$ diffusion weighted direction, and $\lambda$ is a regularization factor, $\delta I_1, \ldots \delta I_N$ are differences between the final images and the initial images, $\delta K_{correct}^{n,i}$ correct is the residual undersampling data obtained by subtracting the k-space data corresponding to the initial image from the undersampled k-space data of the $i^{th}$ coil channel at the $n^{th}$ diffusion weighted direction, and L1 represents L1 norm. In this reconstruction model, the concepts of compressed sensing is adopted, and by subtracting k-space data corresponding to the initial images from the k-space data acquired, the sparsity of the reconstructed images $\delta I_1, \ldots \delta I_N$ in image domain may be enhanced tremendously, thus ameliorating the reconstruction effect based on the theory of compressed sensing.

Figure 5:
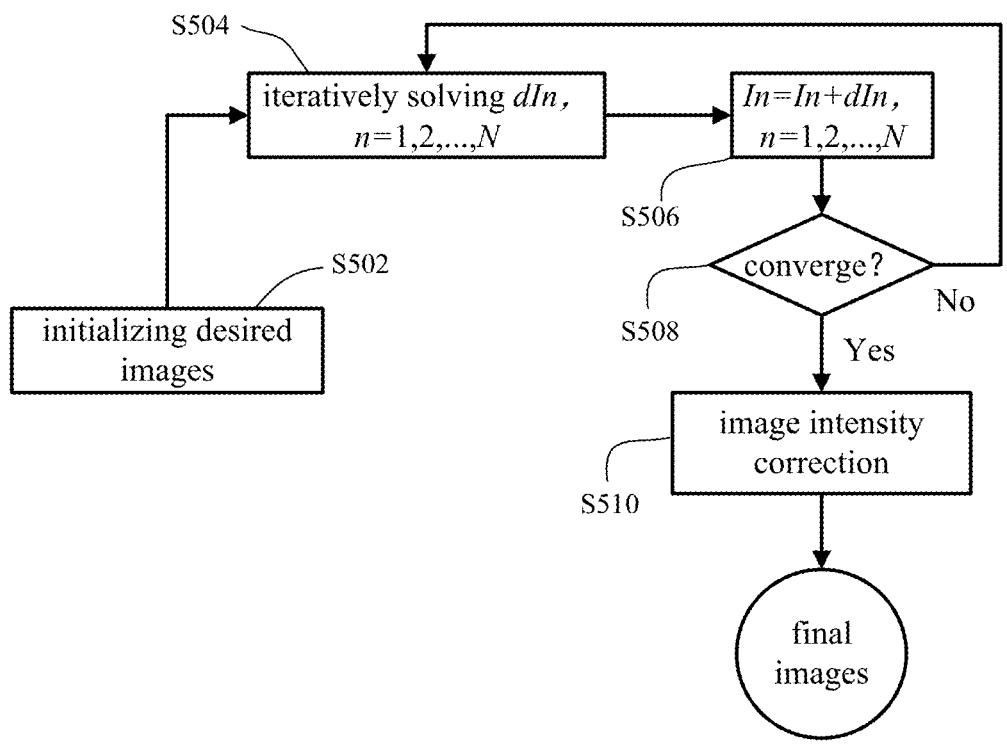
FIG. 5 is a flow diagram of Gauss-Newton iteration method according to an embodiment of the present disclosure.

In all, in the method according to an embodiment of the present disclosure, images in all directions and the coil sensitivities are performed with joint reconstruction. And the initial image obtained by, for example, the image ratio constrained reconstruction may be used as prior knowledge and regularization term of the image reconstruction. Finally, the Gauss-Newton iterating method according to an embodiment of the present disclosure is shown in FIG. 5 for iteration, with the desired final image and the coil sensitivities used as the variables at the same time, and the final images $(I_1, \ldots, I_N)$ are obtained when the mathematical model as described above is converged. Here, the final images $(I_1, \ldots, I_N)$ are the desired image with high resolution and high SNR.

It should be noted that in the proposed reconstruction model, the coil sensitivity S may be firstly calculated, and then the reconstruction may be performed with only the desired final images as variables accordingly.

FIG. 5 shows the process of Gauss-Newton iterating method. Firstly, the variable $(I_1, \ldots, I_N)$ is initiated (S502). And an iterating method, such as the conjugate gradient method, may be used for solving $dI_1, \ldots, dI_N$ (S504), and it is further calculated (S506) until convergence. If it is determined that the calculation is converged at the step S508, then the image contrast or image intensity is further corrected (S510) to obtain the final image at each diffusion weighted direction for diffusion imaging according to the following equation:

$$I_n^{final} = I_n \cdot \sqrt{\sum_{i=1}^{Nc} |S_i|}, n = 1, 2, \ldots, N, \quad (7)$$

From above, by performing the joint image reconstruction at all the N diffusion weighted directions, the images obtained according to the present disclosure may possess higher resolution and SNR compared with the image individually reconstructed for each direction.

In the present disclosure, the concept of common information sharing between different diffusion directions in diffusion imaging is proposed for the first time. And the concept thereof has been successfully proven useful in data collection and image reconstruction. Compared to conventional parallel imaging, the method proposed in the present disclosure proves to be more advantageous.

In addition, complementary information acquisition from different directions is designed and realized for the first time. It reduces redundant data sampling thus increases acquisition speed.

Still further, the images in all diffusion directions are proposed to be jointly reconstructed for the first time. The reconstructed images using this novel algorithm have higher resolution and higher SNR than those using independent reconstruction in each single direction. Thus, the present disclosure solve the core questions of diffusion imaging which may bring tremendous potentials in application of the diffusion imaging in clinical and neuroimaging etc.

Reference throughout this specification to "an embodiment," "some embodiments," "one embodiment", "another example," "an example," "specific examples," or "some examples," means that a particular feature, structure, material, or characteristic described in connection with the embodiment or example is included in at least one embodiment or example of the disclosure. Thus, the appearances of the phrases such as "in some embodiments," "in one embodiment", "in an embodiment", "in another example, "in an example," "in a specific examples," or "in some examples," in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications can be made in the embodiments without departing from spirit and principles of the disclosure. Such changes, alternatives, and modifications all fall into the scope of the claims and their equivalents.

What is claimed is:

1. A method for diffusion magnetic resonance imaging, comprising:
    S1: performing sampling on an object to be sampled at N diffusion weighted directions via multiple-channel coils to acquire k-space data for the N diffusion weighted directions in which a sampling trajectory sampled from any one of the N diffusion weighted directions is complementary with sampling trajectories from the remaining diffusion weighted directions;
    S2: combining the complementary k-space data acquired to obtain a full sampled k-space data Kc;
    S3: performing initial reconstruction to obtain an initial image $(\tilde{I}_1, \ldots, \tilde{I}_N)$ based on images corresponding to the k-space data at the N diffusion weighted directions and an image corresponding to the full sampled k-space data Kc; and S4: performing joint iterative regularized reconstruction to the k-space data in all diffusion weighted directions based on the initial image $(\bar{I}_1, \ldots, \bar{I}_N)$ to obtain the desired final image $(I_1, \ldots, I_N)$.

2. The method of claim 1, wherein the k-space data is acquired by parallel undersampling to the object at the N diffusion weighted directions via the multiple-channel coils.

3. The method of claim 2, wherein the sampling is performed by at least one of echo planar imaging, fast spin echo imaging, PROPELLER imaging, spiral imaging, and VDS imaging.

4. The method of claim 3, wherein the sampling is performed by single-shot imaging or multi-shot imaging with navigator data.

5. The method of claim 2, wherein the joint iterative regularized reconstruction is performed by the following first reconstruction model:

$$[S_1, \ldots, S_{Nc}, I_1, \ldots I_N] = \underset{I,S}{\operatorname{argmin}} \sum_{n=1}^{N} \left( \sum_{i=1}^{Nc} \|F_p(S_i I_n) - K_{correct}^{n,i}\|_2^2 \right) + \lambda \|I_n - \bar{I}_n\|_2^2)$$

where N is the total number of the diffusion weighted directions, Nc is the channel number of the multiple-channel coils, $S_1, \ldots, S_{Nc}$ are coil sensitivities of the channels respectively, $I_1, \ldots I_N$ are the desired final images at the diffusion weighted directions, $F_p$ is the mapping from image domain to k-space, $K_{correct}^{n,i}$ is the k-space data of the $i^{th}$ coil channel at the $n^{th}$ diffusion weighted direction, and $\lambda$ is a regularization factor.

6. The method of claim 2, wherein the joint iterative regularized reconstruction is performed by the following second reconstruction model:

$$[S_1, \ldots, S_{Nc}, \delta I_1, \ldots \delta I_N] = \underset{I}{\operatorname{argmin}} \sum_{n=1}^{N} \left( \sum_{i=1}^{Nc} \|F_p(S_i \cdot \delta I_n) - \delta K_{correct}^{n,i}\|_2^2 + \lambda \|\delta I_n\|_{L1} \right)$$

where N is the total number of the diffusion weighted directions, Nc is the channel number of the multiple-channel coils, $S_1, \ldots, S_{Nc}$ are coil sensitivities of the channels respectively, $I_1, \ldots I_N$ are the desired final images at the diffusion weighted directions, $F_p$ is the mapping from image domain to k-space, $K_{correct}^{n,i}$ is the k-space data of the $i^{th}$ coil channel at the $n^{th}$ diffusion weighted direction, and $\lambda$ is a regularized factor, $\delta I_1, \ldots \delta I_N$ are differences between the final images and the initial images, $\delta K_{correct}^{n,i}$ is the residual undersampling data obtained by subtracting the k-space data corresponding to the initial image from the undersampled k-space data of the $i^{th}$ coil channel at the $n^{th}$ diffusion weighted direction, and the notation L1 represents L1 norm.

7. The method of claim 1, wherein the initial reconstruction is performed based on common information among the images at the N diffusion weighted directions and the image corresponding to the full sampled k-space data Kc.

8. The method of claim 7, wherein the common information is anatomy information, tissue characteristics of the object to be sampled, information relating to a main magnetic field and a transmitting magnetic field applied for sampling the object, sensitivities of receiving coils in the multiple-channel coils or scanning parameters during the diffusion magnetic resonance imaging.

9. The method of claim 1, wherein the k-space data is performed with phase correction to obtain corrected data $K_{correct}^{n,i}$ at the N diffusion weighted directions, where n=1, 2, ..., N, i=1, 2, ..., Nc.

10. The method of claim 9, wherein the corrected data $K_{correct}^{n,i}$ is obtained by performing on the k-space data with linear or non-linear correction based on navigator data.

11. The method of claim 10, wherein the step S3 further comprises:

S31: performing reconstruction on the full sampled k-space data Kc to obtain a first image $\bar{I}_{high}^{c}$;

S32: performing reconstruction to obtain a second image $\bar{I}_{low}^{c}$ from the data satisfying Nyquist-Shannon sampling theorem extracted from a center portion of the full sampled k-space data Kc;

S33: performing reconstruction to obtain a third image $\bar{I}_{low}^{n}$ from the data satisfying Nyquist-Shannon sampling theorem extracted from center portions of the corrected data $K_{correct}^{n,i}$ where n=1, 2, ... N; and S34: performing initial reconstruction to obtain the initial images $(\bar{I}_1, \ldots, \bar{I}_N)$ based on the first image $\bar{I}_{high}^{c}$, the second image $\bar{I}_{low}^{c}$, and the third image $\bar{I}_{low}^{n}$.

12. The method of claim 11, wherein the initial image $\bar{I}_n$ is obtained by image ratio constrained reconstruction using the following formula based on the first image $\bar{I}_{high}^{c}$, the second image $\bar{I}_{low}^{c}$, and the third image $\bar{I}_{low}^{n}$ in the step S34:

$$\bar{I}_n = \bar{I}_{high}^{c} \cdot \frac{\bar{I}_{low}^{n}}{\bar{I}_{low}^{c}},$$

n=1, 2, ..., N.

13. The method of claim 1, wherein the initial reconstruction and the joint iterative regularized reconstruction are performed with at least one of multi-contrast image reconstruction method based on image ratio, compressed sensing, independent component analysis method and multi-contrast image reconstruction using joint entropy.

14. The method of claim 1, wherein an iteratively regularized Gauss-Newton method is used for iteration in the step S4.

15. The method of claim 1, wherein the conjugate gradient method is used for iteration in the step S4.

* * * * *